(12) United States Patent
Cesaretti et al.

(10) Patent No.: US 10,929,252 B2
(45) Date of Patent: *Feb. 23, 2021

(54) CIRCUIT AND METHOD FOR STORING INFORMATION IN NON-VOLATILE MEMORY DURING A LOSS OF POWER EVENT

(71) Applicant: Allegro MicroSystems, LLC, Manchester, NH (US)

(72) Inventors: Juan Manuel Cesaretti, Ciudad de Buenos Aires (AR); Alejandro Gabriel Milesi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/540,409

(22) Filed: Aug. 14, 2019

(65) Prior Publication Data

US 2019/0370125 A1    Dec. 5, 2019

Related U.S. Application Data

(62) Division of application No. 15/720,533, filed on Sep. 29, 2017, now Pat. No. 10,430,296.

(51) Int. Cl.
*G11C 16/22* (2006.01)
*G06F 11/14* (2006.01)
(Continued)

(52) U.S. Cl.
CPC ............ *G06F 11/1469* (2013.01); *G06F 1/28* (2013.01); *G06F 1/30* (2013.01); *G06F 11/1456* (2013.01);
(Continued)

(58) Field of Classification Search
CPC ...................................................... G11C 5/005
See application file for complete search history.

(56) References Cited

U.S. PATENT DOCUMENTS 4,570,594 A    2/1986 Egami et al.
5,869,962 A    2/1999 Kasumi et al.
(Continued)

FOREIGN PATENT DOCUMENTS

DE    101 39 149 A1    2/2003
EP    0 024 836 A1    3/1981
(Continued)

OTHER PUBLICATIONS

U.S. Appl. No. 16/564,287, filed Sep. 9, 2019, Ross et al.
(Continued)

*Primary Examiner* — Douglas King
(74) *Attorney, Agent, or Firm* — Daly, Crowley, Mofford & Durkee LLP

(57) ABSTRACT

A data storage circuit for storing data from volatile memory in response to a power loss, the data storage circuit including an input for receiving a power loss signal in response to a power loss from at least one power source, an input configured to receive data from a volatile memory, a single block of non-volatile matrix of memory cells and a driver circuit coupled to said single row of non-volatile matrix of memory cells. The driver circuit is configured to write data to and read data from said single block of non-volatile matrix of memory cells. The single block of non-volatile matrix of memory cells can be provided as a single row electrically erasable programmable read only memory (EEPROM).

6 Claims, 6 Drawing Sheets

(51) Int. Cl.

| | |
|---|---|
| *G06F 1/28* | (2006.01) |
| *G06F 1/30* | (2006.01) |
| *G11C 5/00* | (2006.01) |
| *G11C 5/14* | (2006.01) |

(52) U.S. Cl.
CPC .............. *G11C 5/005* (2013.01); *G11C 5/143* (2013.01); *G11C 5/148* (2013.01); *G11C 16/225* (2013.01)

(56) References Cited

U.S. PATENT DOCUMENTS

| | | | |
|---|---|---|---|
| 5,917,320 | A | 6/1999 | Scheller et al. |
| 6,044,004 | A | 3/2000 | Kramer |
| 6,091,239 | A | 7/2000 | Vig et al. |
| 6,242,908 | B1 | 6/2001 | Scheller et al. |
| 6,252,395 | B1 | 6/2001 | Aoyama et al. |
| 6,297,627 | B1 | 10/2001 | Towne et al. |
| 6,445,176 | B1 | 9/2002 | Wallrafen |
| 6,459,173 | B1 | 10/2002 | Gunsaulus et al. |
| 6,525,531 | B2 | 2/2003 | Forrest et al. |
| 6,781,359 | B2 | 8/2004 | Stauth et al. |
| 6,815,944 | B2 | 11/2004 | Vig et al. |
| 7,026,808 | B2 | 4/2006 | Vig et al. |
| 7,033,071 | B2 | 4/2006 | Otsuka |
| 7,184,876 | B2 | 2/2007 | Teulings et al. |
| 7,199,579 | B2 | 4/2007 | Scheller et al. |
| 7,265,531 | B2 | 9/2007 | Stauth et al. |
| 7,362,094 | B2 | 4/2008 | Voisine et al. |
| 7,368,904 | B2 | 5/2008 | Scheller et al. |
| 7,369,969 | B2 | 5/2008 | Scherr |
| 7,573,112 | B2 | 8/2009 | Taylor |
| 7,592,801 | B2 | 9/2009 | Bailey et al. |
| 7,622,914 | B2 | 11/2009 | Bailey et al. |
| 7,676,914 | B2 | 3/2010 | Taylor |
| 7,687,882 | B2 | 3/2010 | Taylor et al. |
| 7,772,838 | B2 | 8/2010 | Bailey et al. |
| 7,923,997 | B2 | 4/2011 | Utsuno |
| 8,022,692 | B2 | 9/2011 | Fernandez et al. |
| 8,093,670 | B2 | 1/2012 | Taylor |
| 8,138,750 | B2 | 3/2012 | Fink et al. |
| 8,350,563 | B2 | 1/2013 | Haas et al. |
| 8,598,867 | B2 | 12/2013 | Foletto et al. |
| 8,680,848 | B2 | 3/2014 | Foletto et al. |
| 8,723,512 | B1 | 5/2014 | Burdette et al. |
| 8,729,890 | B2 | 5/2014 | Donovan et al. |
| 8,736,260 | B2 | 5/2014 | Foletto et al. |
| 8,754,640 | B2 | 6/2014 | Vig et al. |
| 8,860,404 | B2 | 10/2014 | Dwyer et al. |
| 8,860,410 | B2 | 10/2014 | Petrie |
| 8,970,265 | B2 | 3/2015 | McIntosh et al. |
| 9,007,054 | B2 | 4/2015 | Friedrich et al. |
| 9,052,349 | B2 | 6/2015 | Haas et al. |
| 9,062,990 | B2 | 6/2015 | Petrie |
| 9,222,990 | B2 | 12/2015 | Dwyer et al. |
| 9,395,391 | B2 | 7/2016 | Fernandez et al. |
| 9,476,899 | B2 | 10/2016 | Fernandez et al. |
| 9,513,337 | B2 | 12/2016 | Forrest et al. |
| 9,520,871 | B2 | 12/2016 | Eagen et al. |
| 9,548,443 | B2 | 1/2017 | Wang |
| 9,625,534 | B2 | 4/2017 | Cadugan et al. |
| 9,644,999 | B2 | 5/2017 | Foletto et al. |
| 9,984,762 | B1 | 5/2018 | Seshasayee et al. |
| 10,066,965 | B2 | 9/2018 | Foletto et al. |
| 10,411,498 | B2 | 9/2019 | Shoemaker et al. |
| 10,430,296 | B2 | 10/2019 | Cesaretti et al. |
| 10,483,846 | B1 | 11/2019 | Allegrini et al. |
| 10,511,223 | B2 | 12/2019 | McIntosh et al. |
| 10,635,539 | B2 | 4/2020 | Cook et al. |
| 2005/0146322 | A1 | 7/2005 | Hoffman et al. |
| 2006/0224350 | A1 | 10/2006 | Tanizawa |
| 2008/0074106 | A1 | 3/2008 | Oohira |
| 2009/0196102 | A1* | 8/2009 | Kim .................. G11C 8/08 365/185.11 |
| 2009/0206829 | A1 | 8/2009 | Kamiya et al. |
| 2010/0023682 | A1 | 1/2010 | Lee et al. |
| 2010/0046121 | A1 | 2/2010 | Osugi et al. |
| 2010/0052424 | A1 | 3/2010 | Taylor et al. |
| 2011/0119015 | A1 | 5/2011 | Hirobe et al. |
| 2012/0170397 | A1 | 7/2012 | Kim et al. |
| 2016/0231393 | A1 | 8/2016 | Fernandez et al. |
| 2017/0117801 | A1 | 4/2017 | Shoemaker et al. |
| 2017/0191852 | A1 | 7/2017 | Foletto et al. |
| 2017/0199536 | A1 | 7/2017 | Verma et al. |
| 2017/0228154 | A1 | 8/2017 | Liu et al. |
| 2018/0259594 | A1 | 9/2018 | Fernandez et al. |
| 2019/0371415 | A1 | 12/2019 | Cesaretti et al. |

FOREIGN PATENT DOCUMENTS

| | | |
|---|---|---|
| EP | 0 456 392 A2 | 11/1991 |
| EP | 0 456 392 A3 | 11/1991 |
| JP | H04-40007 | 2/1992 |
| JP | H11-257993 | 9/1999 |
| JP | 2000-258162 A | 9/2000 |
| JP | 2001-153745 A | 6/2001 |
| JP | 2003-315770 | 11/2003 |
| JP | 2004/040007 | 2/2004 |
| JP | 2004-245804 A | 9/2004 |
| JP | 2004-279324 A | 10/2004 |
| JP | 2008/256415 | 10/2008 |
| JP | 2009/128437 A | 6/2009 |
| JP | 2009-281881 A | 12/2009 |
| JP | 2010/049755 A | 3/2010 |
| WO | WO 2004/079385 A1 | 9/2004 |
| WO | WO 2007/000746 A2 | 1/2007 |
| WO | WO 2008/145662 A1 | 12/2008 |
| WO | WO 2010/010811 A1 | 1/2010 |
| WO | WO 2013/017211 A1 | 2/2013 |

OTHER PUBLICATIONS

Allegro Microsystems, Inc.; Data Sheet ATS673 and ATS674; Self-Calibrating TPOS Gear Tooth Sensor IC Optimized for Automotive Cam Sensing Application; Nov. 2, 2009; 20 pages.

Allegro Microsystems, Inc.; Data Sheet ATS675LSE; Self-Calibrating TPOS Speed Sensor IC Optimized for Automotive Cam Sensing Applications; 2008-2009; 13 pages.

Allegro Microsystems, Inc.; Design Intent Data Sheet; A1340; "High Precision, Highly Programmable Linear Hall Effect Sensor IC with EEPROM and Analog Output with Advanced Output Linearization Capabilities;" Sep. 10, 2009; 40 Pages.

Allegro Microsystems, Inc.; Design Intent Data Sheet; A1341; "High Precision, Highly Programmable Linear Hall Effect Sensor IC with EEPROM, Output Protocols SENT and PWM, and Advanced Output Linearization Capabilities;" May 17, 2010; 46 Pages.

Communication pursuant to Rules 161(1) and 162 EPC dated Apr. 23, 2013 for Pat. App. No. 11767332.7; 2 pages.

Communication pursuant to Article 94(3) EPC dated May 31, 2017 for EP Pat. Appl. No. 12809919.9-1568; 5 pages.

Corrected Notice of Allowability dated May 23, 2016 for U.S. Appl. No. 13/833,847; 7 Pages.

European Notice of Allowance dated Aug. 29, 2014; for European Pat. App. No. 11767332.7; 7 pages.

European Notice of Allowance dated Apr. 5, 2017; for European Pat. App. No. 15156 091.9; 7 pages.

European Response to Written Opinion (including English claims) filed on May 19, 2015; for European Pat. App. No. 12809919.9; 11 pages.

Extended Search Report and Written Opinion of the ISA dated Apr. 21, 2015 for European Pat. App. No. 15156091.9; 9 pages.

Japanese Office Action with English translation dated Oct. 27, 2015; for Japanese Pat. App. 2013-5033859; 4 pages.

Japanese Voluntary Amendment (With Reporting Letter and Claims in English) filed on Jun. 14, 2016 for Japanese application No. 2016-030552; 16 Pages.

Melexis MLX 90324; ""Under-the-Hood" Triaxis Rotary Position feat. SENT Protocol;" 3901090324 Data Sheet; Dec. 2008; 40 pages.

(56) References Cited

OTHER PUBLICATIONS

Notice of Allowance dated Jan. 17, 2014 for U.S. Appl. No. 13/345,021; 15 pages.
Notice of Allowance dated Dec. 19, 2014; for U.S. Appl. No. 13/705,423; 18 pages.
Office Action for U.S. Appl. No. 13/833,847 dated Jul. 2, 2015; 42 pages.
Office Action for U.S. Appl. No. 14/250,574 dated Sep. 2, 2016; 31 pages.
PCT International Preliminary Report on Patentability and Written Opinion of the ISA; dated Apr. 25, 2013; for PCT Pat. App. No. PCT/2011/051493; 10 pages.
PCT International Preliminary Report on Patentability with Written Opinion for PCT/US2012/068879 dated Jul. 17, 2014 7 pages.
PCT International Preliminary Report on Patentability and Written Opinion of the ISA dated Sep. 24, 2015; For Pat. App. No. PCT/US2014/015678; 13 pages.
PCT Search Report and Written Opinion of the ISA dated Nov. 14, 2011 for PCT Pat. App. No. PCT/US2011/051493; 12 pages.
PCT Search Report and Written Opinion of the ISA; dated Mar. 27, 2013 for PCT Pat. App. No. PCT/US2012/068879; 10 pages.
PCT Search Report and Written Opinion of the ISA dated Aug. 21, 2014 for PCT Pat. App. No. PCT/US2014/015678; 18 pages.
Pre-Trial Report with English Translation dated Apr. 14, 2016; for Japanese Pat. App. No. 2013-533859; 9 pages.
Response dated Oct. 2, 2015 to Office Action dated Jul. 2, 2015 for U.S. Appl. No. 13/833,847; 12 Pages.
Response dated Jan. 28, 2016 to European Office Action dated Aug. 3, 2015; for European Pat. App. No. 15156091.9; 5 pages.
Response to European Official Communication filed on Oct. 31, 2013 for European Pat. App. No. 11767332.7; 21 pages.
Response dated Apr. 28, 2016 to Office Action dated Oct. 21, 2015 for European Pat. App. No. 14706448.9; 4 pages.
Response to Office Action dated Sep. 2, 2016 from U.S. Appl. No. 14/250,574, filed Nov. 22, 2016; 14 Pages.
Translation of Reasons for Rejection dated Dec. 26, 2016 for JP Pat. Appl. No. 2016-030552; 11 pages.
U.S. Non-Final Office Action dated Oct. 2, 2018 for U.S. Appl. No. 15/720,533; 14 Pages.
Response to U.S. Non-Final Office Action dated Oct. 2, 2018 for U.S. Appl. No. 15/720,533; Response filed Jan. 2, 2019; 11 Pages.
U.S. Final Office Action dated Mar. 28, 2019 for U.S. Appl. No. 15/720,533; 14 Pages.
Response to U.S. Final Office Action dated Mar. 28, 2019 for U.S. Appl. No. 15/720,533; Response filed Jun. 24, 2019; 9 Pages.
U.S. Notice of Allowance dated Jul. 24, 2019 for U.S. Appl. No. 15/720,533; 9 Pages.
U.S. Notice of Allowance dated Sep. 21, 2020 for U.S. Appl. No. 16/543,867; 8 Pages.

* cited by examiner

CIRCUIT AND METHOD FOR STORING INFORMATION IN NON-VOLATILE MEMORY DURING A LOSS OF POWER EVENT

CROSS REFERENCE TO RELATED APPLICATIONS

This application is a divisional of U.S. application Ser. No. 15/720,533, filed Sep. 29, 2017, which is incorporated herein by reference in its entirety.

BACKGROUND

In many systems, important data may need to be saved upon an interruption of power in order to resume normal system operation when power is restored. In some systems, saving this information requires circuitry having a large backup power source (e.g., a battery and/or large capacitor) having enough stored energy to keep the circuitry operational while data is saved during a shutdown process.

Because non-volatile memory (memory that can retain data without a power connection) is generally slower and less robust for handling repeated in-process data storage, circuits typically include volatile memory (e.g., RAM) for saving data during real-time operations (e.g., tracking in memory the position of a moving object). On the other hand, non-volatile memory such as an electrically erasable read only memory (EEPROM) is often used for storing data when a continuous power source isn't available and/or data needs to be saved and restored when a system powers down and restarts. In some systems, volatile memory may include memory registers which operate to store and/or update the continuous stream of data.

A vehicular electronic steering system is an example of a system which continuously updates memory in order to track and update the position of a steering wheel. Circuitry used in some electronic steering systems includes a so-called "turns count register" that is used to keep count of a number of wheel turns beyond 360 degrees e.g. the number of turns made by a gear tooth. The angular change for which the register is incremented/decremented is programmable.

The turns count register circuitry receives power from a power supply. If the power supply fails or is otherwise disconnected from the circuitry, the information in the turns counter register may be lost.

To prevent loss of information from the turns counter register, the part may also comprise a non-volatile memory (i.e. a memory not affected by the loss of power such as an EEPROM) in which information from the turns counter register may be stored in response to power loss. To transfer data from the part to the non-volatile memory, a control pulse having a predetermined voltage (e.g. 19 volts) must be applied to the EEPROM for a predetermined amount of time (e.g. about 10 milliseconds). One way to ensure that such a pulse is provided in the event of a loss of power from power supply is to have an external capacitor of considerable size (e.g. having a capacitance in the microFarad range) which can power a charge-pump (and associated control circuitry) and the non-volatile memory (e.g. an EEPROM) for an amount of time sufficient for the pulse to be applied.

Such large external capacitors take up critical space where demands for ever smaller circuitry, for which more sensitive data is becoming needed for storage and during a power interruption as such systems become more complex and data intensive. Thus, circuitry for saving larger amounts of data using less power is desired.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with the concepts, systems and techniques described herein, a circuit includes: (a) a matrix of non-volatile memory cells capable of backing up data in the event of a power loss (b) a main memory; (c) a main memory controller coupled to said main memory; (d) a single row of memory cells that are detached from the matrix such that the circuit can be configured to write data to the single detached block without writing or overwriting data in the matrix.

In embodiments, the circuit can be configured such that the detached block operates as if it were a connected block of the matrix.

In embodiments, the matrix is a programmable nonvolatile memory such as an electrically erasable read only memory (EEPROM) and the detached block is a single EEPROM row detached from (or independent of) the EEPROM matrix. It should, of course, also be appreciated that the detachable block may also be provided as a single, detached, EEPROM column or from one or more groups of independent EEPROM cells (e.g. individual cells configured to form or operate as a block).

In embodiments, the circuit can detect loss-of-power events and in response to a detection of a loss of power automatically stores at least portions of contents of main memory (e.g., volatile memory) to the detached block without using the added power that would normally be needed to write to the detached block if it were integrated normally with the matrix memory.

In an embodiment, a turns counter register in non-volatile memory is provided for tracking the movement and/or position of an object. In an embodiment, the turns count register is connected to a steering wheel and column in order to track the position of the steering wheel and thus the position of the steering wheel or steering mechanism. By providing the non-volatile memory as a single EEPROM block (e.g., one or more cells or a row or a column) detached from other blocks in an EEPROM, data from the turns count register can be stored in a portion of the EEPROM without needing to power the entire EEPROM and/or other non-volatile memory.

A circuit provided in accordance with some EEPROM embodiments described herein has at least two advantages over prior art circuits: first, because a single EEPROM block is used, ones and zeros can be programmed concurrently which means that only a single pulse is needed in contrast with conventional EEPROMS which typically require a first pulse to erase the block and a second pulse to set selected bits to a desired logical value—e.g. a logical value of one); and second, since the independent memory (i.e. single EEPROM block) contains its own simpler drivers (e.g. EEPROM drivers) and a simpler overall arrangement, the amount of power needed to activate and/or program the single EEPROM block is much less than is required to power and/or program a conventional EEPROM matrix.

Furthermore, in order to save space required by control switches, the cells (bits) on a conventional EEPROM matrix are not addressed individually, but rather are typically addressed in rows. This may lead to some complications with respect to how the programming/erasing voltages are applied to the EEPROM cells. For example, some conventional EEPROM matrices, utilize ⅓, ⅔ voltages to avoid inadvertently programming other cells in an addressing matrix.

In the embodiments described herein, however, a single pulse is used to program the EEPROM block. There is no need to utilize ⅓, ⅔ voltages common to existing EEPROM designs to avoid inadvertently programming other cells in an addressing matrix. Since there is no need for ⅓, ⅔ voltages, emergency backup data circuits and systems provided in accordance with the concepts described herein need not drive a ⅓, ⅔ resistor divider which saves current. This provides an extra degree of freedom to optimize (i.e., ideally minimize) power consumption and area/complexity.

Thus, use of a single EEPROM block enables concurrent programming of bits with a single pulse and provides an extra degree of freedom to optimize power consumption and area/complexity.

In accordance with one aspect of the concepts described herein, data storage circuit for storing data from volatile memory in response to a power loss includes an input for receiving a power loss signal in response to a power loss from at least one power source, an input configured to receive data from a volatile memory, a single block of non-volatile matrix of memory cells and a driver circuit coupled to said single block of non-volatile matrix of memory cells, said driver circuit configured to write data to and read data from said single block of non-volatile matrix of memory cells, the driver circuit further configured to write to said single block with a single control pulse.

The data storage circuit may include one or more of the following features independently or in combination with one or more other features to include wherein the single block of non-volatile matrix of memory cells is provided as a single block electrically erasable programmable read only memory (EEPROM); wherein the driver circuit is provided as a single block EEPROM driver circuit coupled to the single block EEPROM, the EEPROM driver circuit configured to write data to and read data from the single block EEPROM; wherein the single block of non-volatile matrix of memory cells is a single row EEPROM; wherein the single block EEPROM is provided as one of a plurality of rows and a plurality of columns of a matrix of EEPROM cells configured and arranged for being written to by utilizing collective row and column operations by one or more driver circuits and wherein the single block EEPROM corresponds to an independent block of the matrix of EEPROM cells and wherein the single block of EEPROM cells is further configured such that in response to the data storage circuit receiving a power loss signal, data is written from a volatile memory to the single block of EEPROM cells; where the circuit further includes a controller configured to receive the power loss signal and in response thereto to write data from a volatile memory to the independent single block of non-volatile matrix of memory cells via the single block EEPROM driver circuit; wherein the single block of non-volatile matrix of memory cells is provided as one of a plurality of rows and a plurality of columns of a non-volatile matrix of memory cells configured and arranged for being written to by utilizing collective row and column operations by one or more driver circuits; wherein the single block of non-volatile matrix of memory cells corresponds to an independent block of the matrix of memory cells; wherein the single block of non-volatile matrix of memory cells is further configured and arranged for being written to independently of the other memory cells of the matrix of memory cells in response to the power loss signal.

In accordance with a further aspect of the concepts described herein, a data storage circuit for storing data from volatile memory in response to a power loss includes an input for receiving a power loss signal in response to a power loss from at least one power source, an input configured to receive data from volatile memory, a non-volatile matrix of memory cells comprising a plurality of rows and a plurality of columns configured and arranged for being written to by utilizing collective row and column operations in the absence of a power loss, the plurality of memory cells including an independent subset block of memory cells further configured and arranged for being written to independently of each of the other memory cells in response to the power loss signal and a controller configured to receive the power loss signal and configured to write data from said volatile memory to said independent subset block in response to receiving the power loss signal.

The data storage circuit may include one or more of the following features independently or in combination with one or more other features to include the non-volatile matrix of memory cells forms the memory of an EEPROM; the data storage circuit may further include a plurality of EEPROM column drivers and a plurality of EEPROM row drivers, the plurality of EEPROM column and row drivers arranged and configured to coordinate reading and writing to multiple rows and columns of the EEPROM; an energy storing device; the controller is configured, in response to the power loss signal, to selectively direct energy from the energy storing device to writing of data from said volatile memory to said independent subset block; a clock signal generator, wherein the coordinated reading and writing from said plurality of column and row drivers is timed to a clock signal from the clock signal generator and wherein the writing of data from said volatile memory to said independent subset block in response to the power loss signal is controlled without utilizing a clock signal; wherein the controller is configured to write to the independent subset block in response to a power loss signal without overwriting at least a portion of the plurality of memory cells of the EEPROM; wherein the controller is configured to write to the independent subset block in response to a power loss signal without writing to any other of the plurality of memory cells of the EEPROM; an independent memory driver configured to be selectively powered from the energy storing device to write to the independent subset block in response to a power loss signal; wherein said independent subset block is an independent row of said EEPROM further comprising an independent row driver configured to be selectively powered from the energy storing device to write to the independent row in response to a power loss signal; wherein the energy storing device comprises a charge pump and a charge pump switch configured to release power stored in the charge pump when switched, the charge pump switch coupled between the charge pump and the independent memory driver and configured to switch closed by receiving a signal from the controller in response to the power loss signal; wherein the controller is arranged and configured to write data from said volatile memory to said independent subset block in less than about 10 milliseconds; wherein the volatile memory includes a turns count register configured and arranged to store a value representing the angle of rotation of an object; wherein the object is the steering wheel of a vehicle; wherein the volatile memory includes a turn register configured and arranged to store a value representing the rate of rotation of an object.

In accordance with a still further aspect of the concepts described herein, a method of transferring data from a volatile memory circuit to an EEPROM during a power interruption includes transmitting a power loss signal in a primary circuit, the power loss signal representing that a power supply coupled to the primary circuit has been interrupted, receiving the power loss signal in a controller, the controller configured to, in response to receiving the power loss signal, writing data from the volatile memory circuit to an independent EEPROM memory block of a matrix of memory cells of the EEPROM, the matrix having a plurality of rows and a plurality of columns of memory cell;, wherein the writing occurs while not writing to any of the other rows of the EEPROM that do not contain the memory block; and operating the matrix of memory cells, including the independent memory block, utilizing collective row and column EEPROM operations while the power loss signal is not active.

The data storage method may include one or more of the following features independently or in combination with one or more other features to include the writing to the independent block of the EEPROM is powered by residual power in the primary circuit; the residual power is supplied by power stored in a charge pump, the charge pump's residual power released by switching a charge pump switch in response to the power loss signal; writing data from the volatile memory circuit to an independent EEPROM block is executed without utilizing a clock signal.

In accordance with a still further aspect of the concepts described herein, a data storage circuit for storing data from volatile memory in response to a power loss includes means for writing data, in response to a power loss in the data storage circuit, from volatile memory to an independent memory clock of a matrix of non-volatile memory cells while not writing data to other memory cells of the matrix.

The data storage circuit may include one or more of the following features independently or in combination with one or more other features to include the non-volatile memory cells are cells of an EEPROM.

In an embodiment, the non-volatile memory cells are cells of an EEPROM.

In accordance with an integrated data storage circuit (IC) for storing data from volatile memory in response to a power loss includes volatile memory means, non-volatile memory means, means for detecting a loss of power to the IC and for providing a power loss signal in response to detection of a loss of power, and means, responsive to the power loss signal, for transferring data from said volatile memory means to said non-volatile memory means in response to the power loss signal.

In an embodiment, the non-volatile memory means is an EEPROM block means.

In an embodiment, the energy storage means is a capacitor and charge pump means.

In accordance with a still further aspect of the concepts described herein, a data storage circuit includes a charge pump, a main memory, a turns count register, a memory matrix of non-volatile memory cells, a main memory controller coupled to said main memory; an EEPROM memory block detached from the main memory controller and the memory matrix, one or more EEPROM programming switches, a first switch coupled between said charge pump and said EEPROM programming switches and a digital controller coupled to said first switch, said EEPROM programming switches and to said EEPROM wherein, in response to a loss of power to the turns count register, the digital controller places the first switch in a closed position such that said charge pump provides a signal which keeps the EEPROM programming switches biased for a period of time sufficient for data in the turns count register to be stored in a said detached EEPROM memory block.

In accordance with a still further aspect of the concepts described herein a data storage circuit for storing data from volatile memory in response to a power loss includes an input for receiving a power loss signal in response to a power loss from at least one power source, an input configured to receive data from a volatile memory, an energy storage devices, one or more switch elements coupled between the energy storage device and said single block of nonvolatile matrix of memory cells said one or more switch elements configured to selectively couple said single block of nonvolatile memory to said energy storage device in response to an indication of power loss, a single block of non-volatile matrix of memory cell and a driver circuit coupled to said single block of non-volatile matrix of memory cells, said driver circuit responsive to the power loss signal and configured to write data to and read data from said single block of non-volatile matrix of memory cells, the driver circuit further configured to write to said single block with a single control pulse in response to an indication of power loss provided thereto.

In an embodiment, the period of time is about 10 milliseconds or less.

In an embodiment, the energy storage device is configured to store no more than about the energy required to keep the EEPROM programming switches biased for the period of time.

BRIEF DESCRIPTION OF THE DRAWINGS

Other aspects, features, and advantages of the claimed concepts will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features. Furthermore, the drawings are not necessarily to scale, emphasis instead being placed on the concepts disclosed herein.

The foregoing features may be more fully understood from the following description of the drawings in which.

DETAILED DESCRIPTION

Figure 1:
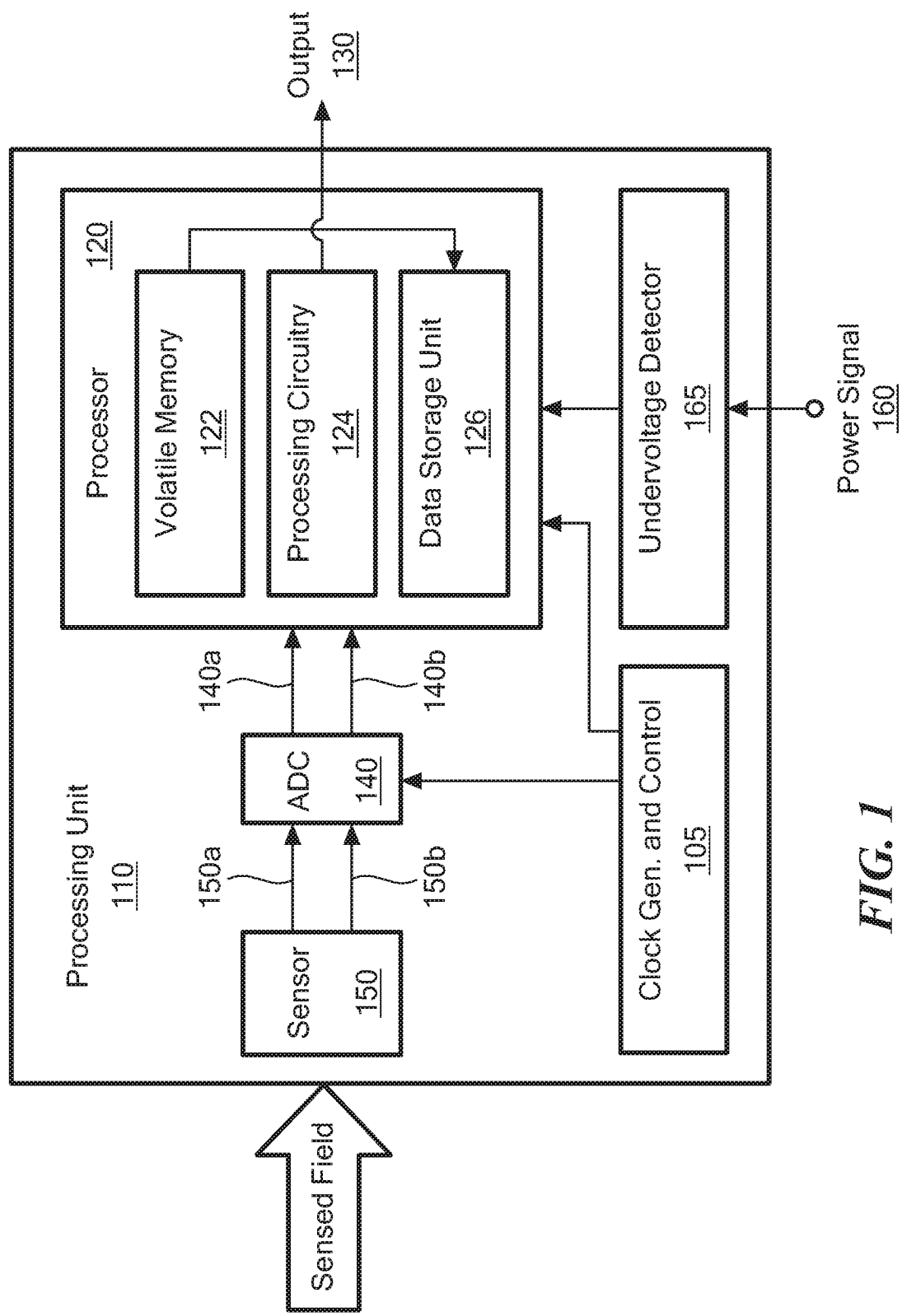
FIG. 1 is a block diagram of a circuit for storing information in non-volatile memory in response to a loss of power according to some embodiments.

Referring now to FIG. 1, a block diagram of an example circuit for storing information in non-volatile memory in response to a loss of power according to some embodiments is shown. A processing unit 110 receives input in a sensor 150 from a sensed field 145. In an embodiment, one or more analog signals 150a and 150b from the sensor 150 (e.g., a magnetic field sensor) are transmitted to an analog to digital converter (ADC) 140. ADC 140 receives the analog signals provided thereto and generates digital signals 140a and 140b that are further transmitted or otherwise coupled or provided to a digital processor 120.

Data from the ADC can be stored in main volatile memory 122 (e.g., RAM) or in a data storage unit 126 used at least in part for non-volatile data storage. Processing circuitry 124 processes storage of data in volatile memory 122 and data storage unit 126. A clock generator and timer circuit 105 is configured to send clock signals to the ADC 140 and processor 120 in order to time the processing, delivery, and storage of data from the ADC. In embodiments, the processing unit outputs signals 130 (including data from volatile memory 122 and the data storage unit 126) to components such as, for example, other elements of a system in which the processing unit 110 is integrated (e.g., the drive mechanism shown in FIG. 5).

A power loss detector 165 can detect a power loss in power signal 160 and in response thereto may deliver one or more signals to processor 120 indicating if appropriate power levels from a power source (not shown) is being provided to processing unit 110 (or to one or more circuits within processing unit 110).

In the event of receiving a power loss signal from detector 165, processor 120 is configured and programmed to begin a data retention process that transfers specific data present from volatile memory 122 into non-volatile memory (e.g., in data storage unit 126) such as further described in embodiments herein. In certain embodiments, the retention process utilizes and selectively focuses stored power on saving the specific data to selected non-volatile memory 122 such as an individual and detached electrically erasable read only memory (EEPROM) block (e.g., see FIGS. 2, 3, 4, and 6). This way, more data can be saved during a power loss and recovered when power is restored to the processing unit 110, without the need for high-footprint power storage elements (e.g., batteries, large capacitors) needed to power and operate an entire data storage system for long enough periods of time to save sensitive data.

Figure 4:
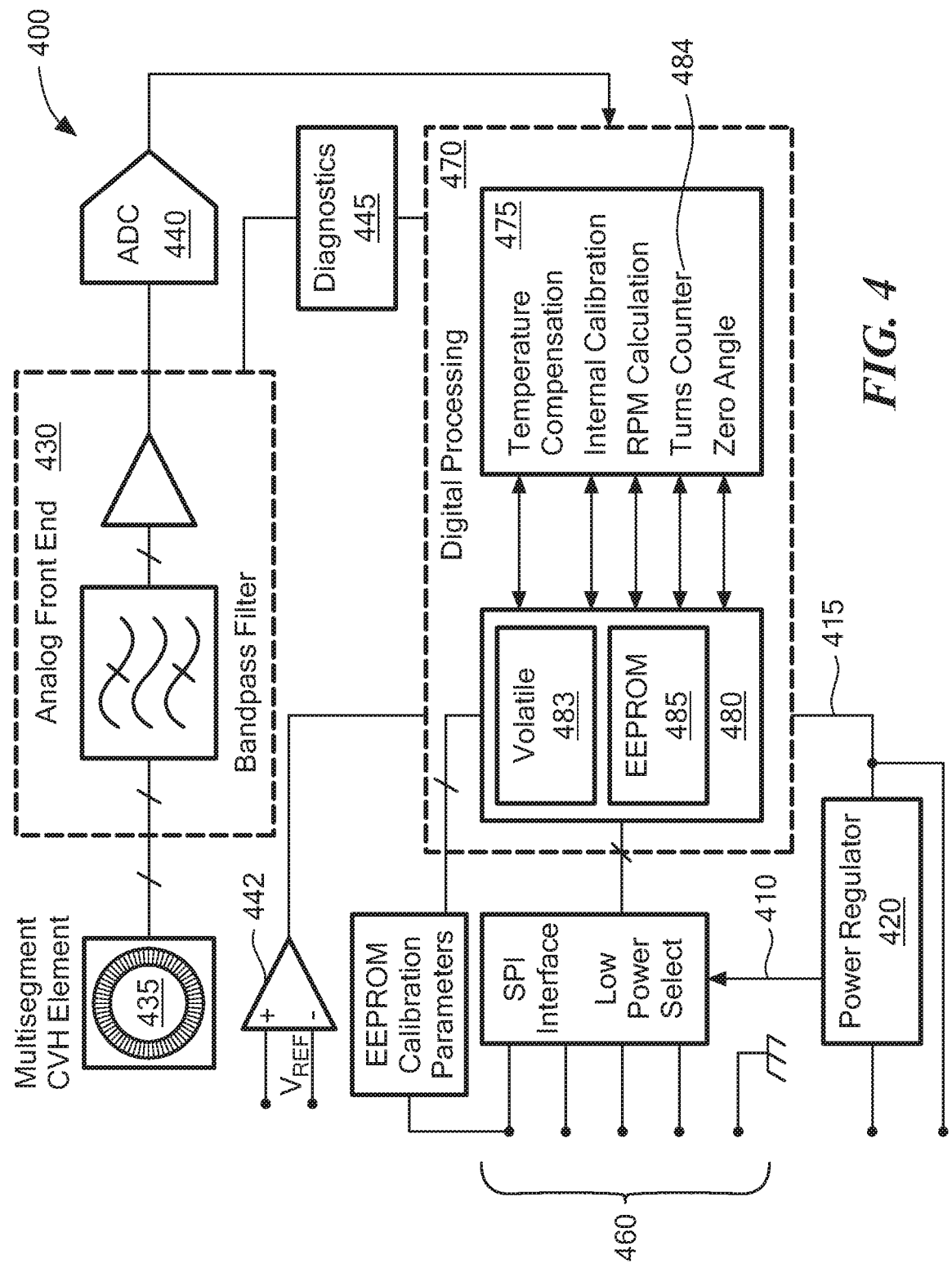
FIG. 4 is a block diagram of a circuit for storing information from register memory to an EEPROM in response to a loss of power according to some embodiments.
Figure 5:
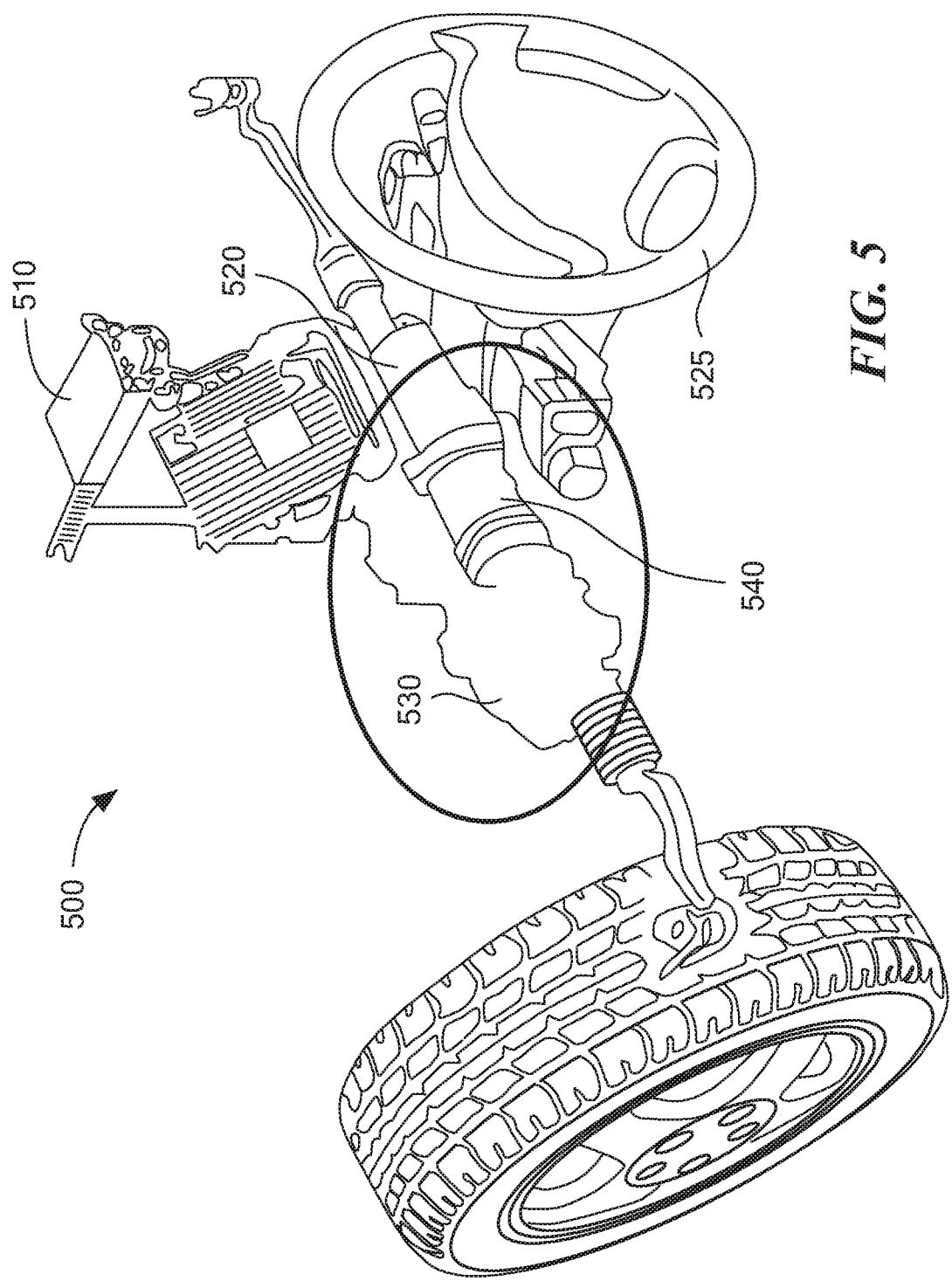
FIG. 5 is an isometric view of a portion of a vehicle which includes a circuit for storing information in non-volatile memory in response to a loss of power memory in response to a loss of power according to some embodiments.

In some embodiments, the sensed field corresponds to a system of magnetic field sensors used, for example, to track the position and/or rotation of an object such as a steering column of a vehicle (see, e.g., FIGS. 4 and 5 and accompanying description). In order to facilitate real-time tracking of the wheel rotation, a turns count register, for example, in volatile memory may be used to store input from a turns counter. When power to the system is interrupted, present embodiments can be used to transfer and save the position stored in the turns count register to non-volatile memory such as described. When the power to the system is restored, the turns count register can be updated from non-volatile memory.

Figure 2:
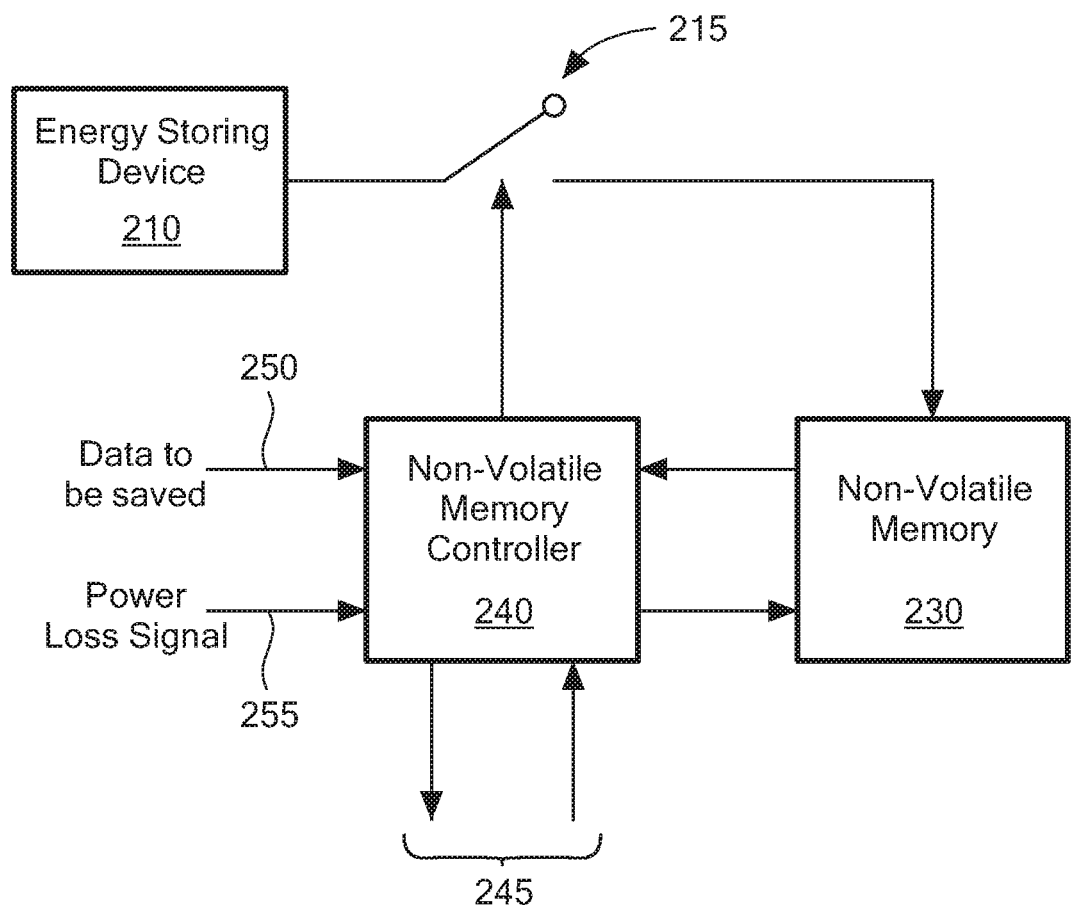
FIG. 2 is a block diagram of a circuit for storing information in non-volatile memory in response to a loss of power according to some embodiments.

Referring now to FIG. 2, a block diagram of a circuit for storing information in non-volatile memory in response to a loss of power is provided according to some embodiments. In an embodiment, an energy storage device 210 is configured for storing energy and for providing energy for saving data 250 (e.g., from a volatile memory) to non-volatile memory 230. Energy storage device 210 may, for example, be provided as one or more capacitive elements, a chargeable energy cell, one or more inductive elements or combinations of the above. A memory controller 240 is programmed and configured to receive data 250 and save the data to non-volatile memory 230 in response to a power loss signal 255. When the memory controller 240 receives power loss signal 255, controller 240 transmits a signal to one or more switch elements, here represented as a switch 215, that causes the switch (or switch elements) 215 to release power from the energy storage device 210 to power non-volatile memory (e.g. by closing the switch to provide a signal path between the energy storage device and the non-volatile memory).

The released power from energy storage device 210 allows data 250 which is forwarded from memory controller 240 to be stored in non-volatile memory 230. In an embodiment, non-volatile memory 230 is specially arranged to utilize that power from device 210 for only storing selected data to a dedicated selected portion of non-volatile memory 230 (e.g., a detached EEPROM block). In embodiments, that portion of non-volatile not used for storing the selected data is not powered by the released power from energy storage device 210. Further, in an embodiment, any portions of controller 240 needed to store data in memory 230 also receive power such as from an alternate power supply that provides power in the event of a power loss (e.g., backup power supply 350 of FIG. 3).

In an embodiment, during normal, fully powered operation, memory controller 240 manages the storage and transmission of data delivered through I/O interface 245, which can be stored in non-volatile memory 230 or volatile memory (not shown). In an embodiment, all of non-volatile memory 230 is powered and utilized during normal, fully powered operation.

Figure 3:
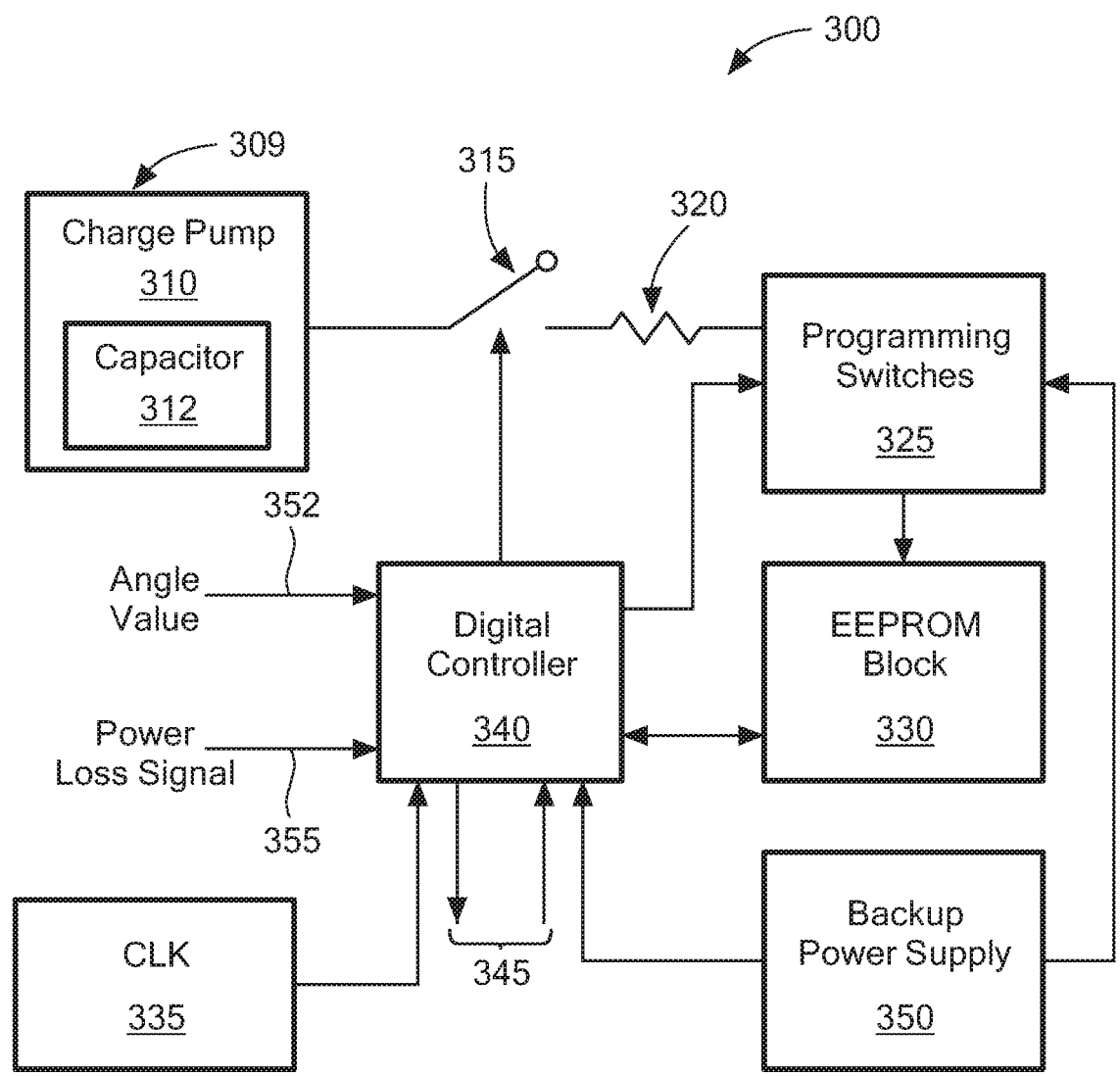
FIG. 3 is a block diagram of a circuit for storing information in an electrically erasable read only memory (EEPROM) block in response to a loss of power according to some embodiments.

Referring now to FIG. 3, a circuit 300 includes a charge pump 310 coupled through a switch 315 to a first terminal of a resistor 320. The second terminal of resistor 320 is coupled to an input of an EEPROM programming switch block 325. An output of programming switch block 325 is coupled to an electrically erasable programmable read only memory (EEPROM) block 330. When switches of switch block 325 are powered, they can be used to apply power to and program cells of EEPROM block 330 (depending upon the polarity of signal, a one or zero will be stored). EEPROM block 330 provides data to digital controller 340 in response to signals provided thereto. Digital controller 340 is coupled to switch 315 and programming switches 325 and provides control signals thereto such as for programming EEPROM block 330 with stored values. Digital controller 340 thus may configure programming switches 325 and may also access EEPROM 330 to read and/or write data thereto. In embodiments, an EEPROM block 330 is provided as a standalone single EEPROM block and may contain relatively simple and low power driver circuits which allows digital bits (e.g. ones and zeros) to be programmed concurrently via a single control pulse. Thus, use of a simple EEPROM block (e.g., a single row) enables concurrent programming of bits with a single pulse while needing a relatively small amount of power.

In an embodiment, a storage capacitor 312 within charge pump 310 is at substantially all times maintained at a reference voltage. The value of the reference voltage may be selected to suit the needs of a particular application, For example, in some applications, the reference voltage may be 15 V, in other applications the reference voltage may be 19 V and in still other applications other voltage levels greater than 19V or less than 15V may be used. In other embodiments, the charge pump is charged when a loss of power is detected, and its voltage maintained at the reference voltage (e.g., via a low power control circuit).

The switches to the EEPROM block 330 are also preconfigured (that is, set during "normal power" operation) to write desired data. In an embodiment, a backup power source 350 is connected to digital controller 340 and programming switches 325, and maintains power to these components for a period of time in the event of a power loss sufficient to bias digital controller into an operating state so that digital controller can operate one or both of switches 315, 325, charge pump 310 is dedicated to charging EEPROM block 330 in the event of a power loss. Thus, in this embodiment, backup power supply is relatively small, i.e. stores a relatively small amount of power compared with the energy storage device (here provided from charge pump 310 and capacitor 312) which provides power to the non-volatile memory (here provided as EEPROM block 330). In some embodiments, backup power supply 350 may be omitted or provided as part of energy storage device 309 in which case, energy storage device 309 provides power to digital control 340 and switches 315, 325.

A power loss can be signaled to digital controller 340 by a power loss signal 355 (e.g., by way of a power loss detector such as described herein). In an embodiment, digital controller then closes switch 315 and delivers signals to programming switches 325 in order to power and program EEPROM block 330.

In response to a loss of power, in an embodiment, the capacitor 312 and charge pump 310 then deliver a burst of power to an independent non-volatile memory block. In an embodiment, power is provided to the non-volatile memory block at a substantially constant voltage for a predetermined period of time. In one embodiment, a burst of power is delivered at around the reference voltage for about 10 ms. In one embodiment, the reference voltage is about 15 V or 19 V and the predetermined period of time is about 10 ms. In an embodiment, the capacitor 312 and charge pump 310 then deliver a burst of power to the independent EEPROM block 330 via the resistor 320 so as to provide a non-instantaneous ramp up and guarantee the required rise time of a high voltage pulse, thereby protecting the integrity of floating gates' within the EEPROM block 330 and keep the EEPROM block programming switches 325 biased for 10 ms (with negligible or very small static current consumption). In view of the present disclosure, various embodiments can be implemented as would be realized by one of ordinary skill in the art without the use of a resistor (such as resistor 320) that similarly avoid impacting the integrity of the floating gates within EEPROM block 330.

In an embodiment, if a clock 335 is driving circuit 300 during normal operation, the clock can be stopped (i.e., so it discontinues drawing power) or disconnected from the controller 340 and programming switches 325 so as a digital block within the controller 340 is frozen with the correct addressing for the switches 325, so the backup power supply 350 providing power to controller 340 in the event of a power loss can be relatively small.

In an embodiment, a volatile memory register (e.g., a turns count register) that stores the state of a field element (e.g., data from a turns counter such as, e.g., provided by an angle value signal 352) stored could be powered from an independent sub-supply e.g., backup supply 350) that remains on through its own small capacitor.

In some systems which already include an external capacitor (e.g. an integrated circuit or chip having an external capacitor coupled thereto) there is the option of repurposing such capacitor so that it is used for loss of power biasing (e.g. as backup power supply 350). Thus, such existing components and/or circuitry may be used for loss-of-power biasing (e.g., to controller 340), thereby avoiding the need for extra package pins or additional external components.

Referring now to FIG. 4, a block diagram of a circuit 400 for storing information from register memory (e.g., volatile memory 483) to an EEPROM 485 in response to a loss of power is provided. Also referring to FIG. 5, an isometric view of a steering system 500 of a vehicle (not shown) which includes a circuit (e.g., circuit 400 of FIG. 4) for storing information in non-volatile memory in response to a loss of power is provided according to some embodiments.

With reference to FIG. 4, an embodiment, a circular vertical hall (CVH) element 415 provides angular measurements of a rotating object (see, e.g., wheel 525). CVH element 415 provides angular analog data to an analog front end 430, which further processes the data via filtering and amplification operation and forwards the processed data to an analog-to-digital (ADC) converter 440. The ADC converts the analog data into digital data 441 for processing by digital processing circuit 470. The circuit 400 can be powered from a power source (e.g., a battery and/or external power).

In other embodiments, the angle sensor 435 can be of a different type, for example GMR, AMR, TMR, vertical Hall sensors in X and Y directions.

Digital processing circuit 470 can include circuitry to perform numerous data processing functions including a turns counter, a zero-angle monitor, a calibration process, and an RPM calculator among other functions known to those of ordinary skill in the art.

The circuit 400 can be integrated with, for example, a control unit 510 positioned on a rack 520 (FIG. 5) while CVH 415 can be connected to wheel 525 (FIG. 5) and/or a steering sensor 530 (FIG. 5) of a steering system 500 (FIG. 5) driven by a motor 540 (FIG. 5).

The digital processing circuit 470 includes memory block 480 including volatile memory 483 and non-volatile memory with an EEPROM 485. Volatile memory 483 can be used to store data associated with the aforementioned processing functions including, for example, by providing a turns count register to rapidly track and update turns count data from, for example, a turns counter 484. EEPROM 485 can be used to retain data associated with these processes, and such data may be provided to EEPROM 485 at various points in time such as when the circuit is shut down and depowered. For example, calibration and startup parameters specific to the CVH 435 can be saved in EEPROM 485 for use during startup and initialization of the circuit. The position of steering wheel 525, for example, tracked by a turns count register, can be saved to EEPROM 485 when power to the steering system 500 is interrupted or turned off so that when the steering system 500 is powered back on, the turns count register can be updated via the EEPROM 485 containing its last known position.

Figure 6:
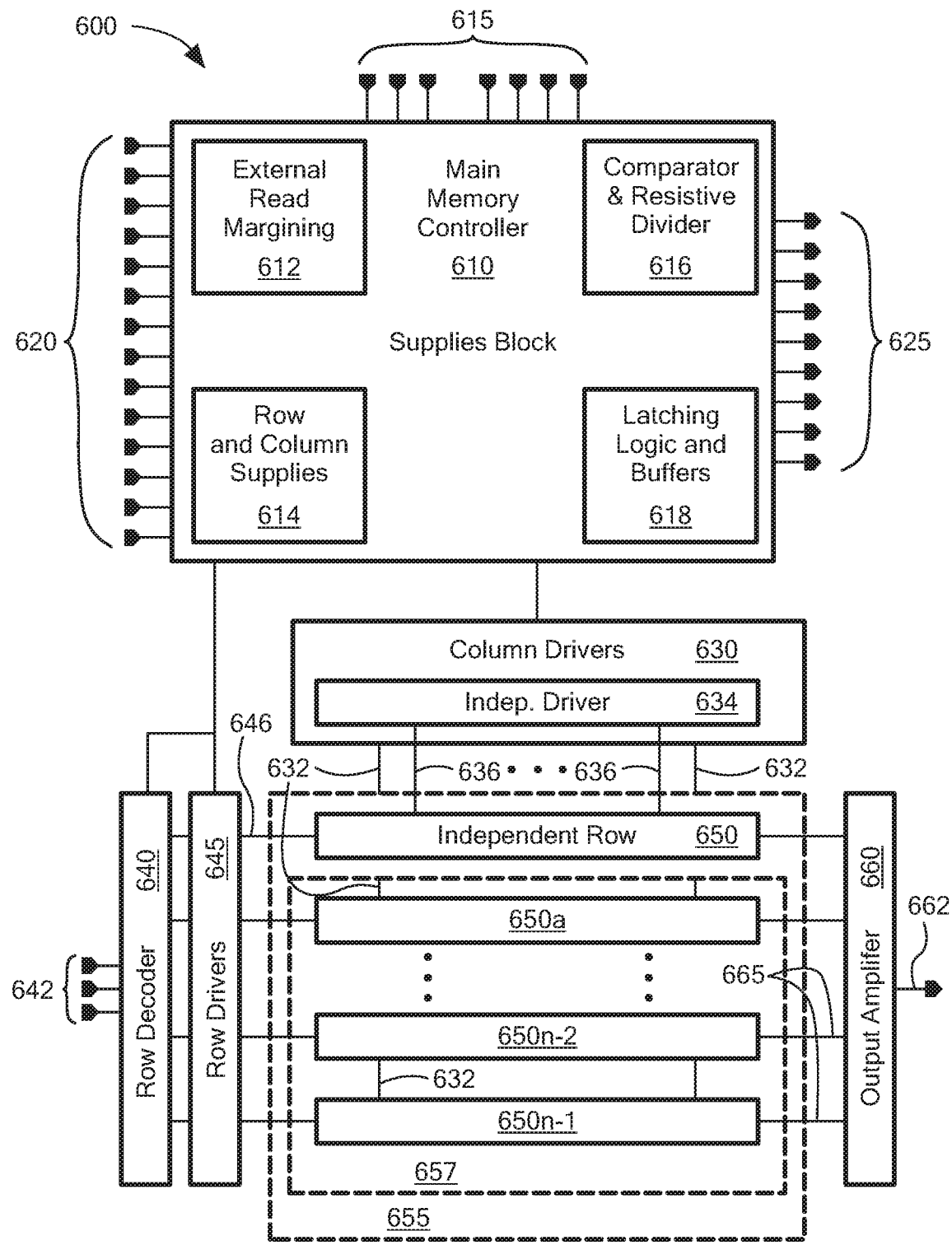
FIG. 6 is a block diagram of an electrically erasable read only memory (EEPROM) having a designated single EEPROM row for use in a circuit for storing information in non-volatile memory in response to a loss of power according to some embodiments.

Referring now to FIG. 6, a block diagram of an EEPROM 600 having a designated single EEPROM row 650 for use in a circuit for storing information in non-volatile memory in response to a loss of power is provided according to some embodiments. A main memory controller 610 includes inputs 615 and 620 for control signals and data to be stored in the EEPROM 600 and outputs 625 for signals and data transmitted from EPPROM 600. The memory controller 610 further includes components 612 for external read margining and 618 with latching logic and buffers as would be understood by one of ordinary skill in the art. Comparator and resistive divider block 616 and row and column supplies 614 help facilitate reading and writing data to EEPROM rows 650, 650a . . . 650n-1. During normal, fully powered operation, column drivers 630 and row drivers 645 (e.g., containing row and column programming switches) work in concert to read and write data to EEPROM rows 650, 650a . . . 650n-1. A row decoder 640 calculates the appropriate row signals during reading and writing and has inputs 642 for receiving external signals and data for saving data to EEPROM rows.

EEPROM row 650 is independently writable from memory controller 610 and an independent memory driver. Independent memory driver 634 can utilize direct connections 636 to write directly to independent row 650 without the need to fully power general row and column drivers 630 and 645 and connections 632 and 646, thus saving power that would otherwise be necessary to write to a non-independent row (e.g., rows 650a . . . 650n-1). In this embodiment, driver 634 drives each of the columns of the row, however, there is only one cell per column.

In should be appreciated that independent row 650 can be substituted for other memory configurations that can include, for example, blocks of memory cells formed from numerous columns and rows or portions thereof.

The concepts, circuits, systems and techniques described herein find broad applicability in the sensor circuitry industry. Specifically, the conceived independent EEPROM row and described configurations therefor can be used in sensor systems that are based upon sensing and storing various types of continuous data that are used to track components thereof, such as generated from other components of vehicular systems like drive trains and other systems that need to store select sensitive data in the event of electric power interruptions).

It should be appreciated that portions of the processing described herein may be performed by circuits, such as a digital signal processor circuit, an application specific integrated circuit (ASIC), a field programmable gate array (FPGA), or conventional electrical or electronic systems or circuits. Some processing may be manually performed, while other processing blocks may be performed by circuitry and/or one or more processors. It should be noted that unless otherwise indicated herein, the particular sequences or processes described are illustrative only and can be varied without departing from the spirit of the concepts described and/or claimed herein. Thus, unless otherwise stated, the processes described are unordered meaning that, when possible, the sequences described can be performed in any convenient or desirable order.

While particular embodiments of concepts, systems, circuits and techniques have been shown and described, it will be apparent to those of ordinary skill in the art that various changes and modifications in form and details may be made therein without departing from the spirit and scope of the concepts, systems and techniques described herein. For example, some of the presented implementation examples show a system which saves a single piece of type of data. It will be appreciated that the concepts described herein can be used in systems in which it is necessary or desirable to save a variety of different types or pieces of data in which case it may be necessary to use EEPROMs having more than one block or row or to use multiple, single block or row EEPROMs and associated circuitry.

The data for saving in an independent EEPROM block is ideally selected depending upon the particular type of system fields that need to be restored upon startup (e.g. last known position in a GPS, orientation, time).

Having described preferred embodiments which serve to illustrate various concepts, systems circuits and techniques, which are the subject of this patent, it will now become apparent to those of ordinary skill in the art that other embodiments incorporating these concepts, systems circuits and techniques may be used. For example, it should be noted that individual concepts, features (or elements) and techniques of different embodiments described herein may be combined to form other embodiments not specifically set forth above. Furthermore, various concepts, features (or elements) and techniques, which are described in the context of a single embodiment, may also be provided separately or in any suitable sub-combination. It is thus expected that other embodiments not specifically described herein are also within the scope of the following claims.

In addition, it is intended that the scope of the present claims include all other foreseeable equivalents to the elements and structures as described herein and with reference to the drawing figures. Accordingly, the subject matter sought to be protected herein is to be limited only by the scope of the claims and their equivalents.

It should thus be appreciated that elements of different embodiments described herein may be combined to form other embodiments which may not be specifically set forth herein. Various elements, which are described in the context of a single embodiment, may also be provided separately or in any suitable subcombination. Other embodiments not specifically described herein are also within the scope of the following claims.

It is felt, therefore that the concepts, systems, circuits and techniques described herein should not be limited by the above description, but only as defined by the spirit and scope of the following claims which encompass, within their scope, all such changes and modifications.

All publications and references cited herein are expressly incorporated herein by reference in their entirety.

We claim:

1. A data storage circuit for storing data, from volatile memory having a turns count register for storing a value representing an angle of rotation of an object, in response to a power loss, the data storage circuit comprising:
   a non-volatile matrix of memory cells comprising an independent subset block of memory cells; and
   a controller comprising a plurality of drivers including row and column drivers and an independent driver, the controller configured to:
   in the absence of a power loss, write data from the volatile memory to the non-volatile matrix of memory cells using the row and column drivers to perform collective row and column operations; and
   in response to receiving a power loss signal write data from said volatile memory to said independent subset block by selectively supplying energy to the independent driver and not the row and column drivers.

2. The data storage circuit of claim 1 wherein the object is the steering wheel of a vehicle.

3. The data storage circuit of claim 1 further comprising an energy storing device, wherein the non-volatile matrix of memory cells forms the memory of an EEPROM, and wherein the row and column drivers are EEPROM row and columns drivers, respectively, and wherein the controller is further configured, in response to receiving the power loss signal, to selectively supply energy from the energy storing device to the independent driver.

4. The data storage circuit of claim 3 wherein the controller is arranged and configured to write data from said volatile memory to said independent subset block in less than about 10 milliseconds.

5. A method of storing data from volatile memory having a turns count register for storing a value representing an angle of rotation of an object, the method comprising:
   in response to a controller circuit receiving a signal indicating a loss of power in the volatile memory, from a primary circuit coupled to the volatile memory and comprising a charge pump: writing the data by the controller circuit from the volatile memory into a single row of an EEPROM memory having a plurality of row drivers,
   wherein writing the data into the single row includes powering only a single row driver of the plurality by releasing residual power from the charge pump.

6. The method of claim 5 wherein writing the data into the single row by the controller does not utilize a clock signal.

* * * * *

UNITED STATES PATENT AND TRADEMARK OFFICE
CERTIFICATE OF CORRECTION

PATENT NO. : 10,929,252 B2
APPLICATION NO. : 16/540409
DATED : February 23, 2021
INVENTOR(S) : Juan Manuel Cesaretti et al.

It is certified that error appears in the above-identified patent and that said Letters Patent is hereby corrected as shown below:

In the Specification

Column 1, Line 29 delete "erasable read" and replace with --erasable programmable read--.

Column 1, Line 41 delete "degrees e.g." and replace with --degrees, e.g.--.

Column 2, Line 16 delete "loss (b)" and replace with --loss; (b)--.

Column 2, Lines 24-25 delete "nonvolatile" and replace with --non-volatile--.

Column 2, Line 59 delete "one);" and replace with --one;--.

Column 3, Line 5 delete "matrices," and replace with --matrices--.

Column 5, Line 15 delete "cell;," and replace with --cells;--.

Column 5, Line 17 delete "block;" and replace with --block,--.

Column 5, Line 44 delete "accordance with an" and replace with --accordance with an embodiment, an--.

Column 5, Line 61 delete "memory;" and replace with --memory,--.

Column 6, Line 8 delete "herein a" and replace with --herein, a--.

Column 6, Line 13 delete "devices," and replace with --device,--.

Column 6, Line 15 delete "nonvolatile" and replace with --non-volatile--.

Column 6, Line 15 delete "cells said" and replace with --cells, said--.

Signed and Sealed this
Twenty-eighth Day of June, 2022

Katherine Kelly Vidal
*Director of the United States Patent and Trademark Office*

CERTIFICATE OF CORRECTION (continued)
U.S. Pat. No. 10,929,252 B2

Column 6, Line 17 delete "nonvolatile" and replace with --non-volatile--.

Column 6, Line 19 delete "cell" and replace with --cells--.

Column 6, Lines 64-65 delete "memory in response to a loss of power memory in response to a loss of power according" and replace with --memory in response to a loss of power according--.

Column 8, Line 26 delete "non-volatile not" and replace with --non-volatile memory not--.

Column 9, Line 1 delete "application, For" and replace with --application. For--.

Column 9, Line 15 delete "controller into" and replace with --controller 340 into--.

Column 9, Line 16 delete "controller can" and replace with --controller 340 can--.

Column 9, Line 17 delete "325, charge" and replace with --325. Charge--.

Column 9, Line 31 delete "controller then" and replace with --controller 340 then--.

Column 9, Line 48 delete "gates'" and replace with --gates--.

Column 9, Line 66 delete "turns counter" and replace with --turns count register--.

Column 10, Line 1 delete "sub-supply e.g." and replace with --sub-supply (e.g.--.

Column 10, Line 46 delete "memory with an EEPROM" and replace with --memory EEPROM--.

Column 11, Line 3 delete "EPPROM" and replace with --EEPROM--.

Column 11, Line 27 delete "In" and replace with --It--.

Column 11, Line 40 delete "interruptions)." and replace with --interruptions.--.

Column 12, Line 8 delete "systems circuits" and replace with --systems, circuits--.

Column 12, Line 11 delete "systems circuits" and replace with --systems, circuits--.